(12) United States Patent
Bathan et al.

(10) Patent No.: US 11,469,149 B2
(45) Date of Patent: Oct. 11, 2022

(54) SEMICONDUCTOR DEVICE AND METHOD OF FORMING MOLD DEGATING STRUCTURE FOR PRE-MOLDED SUBSTRATE

(71) Applicant: Semtech Corporation, Camarillo, CA (US)

(72) Inventors: Henry Descalzo Bathan, Simi Valley, CA (US); Zigmund Ramirez Camacho, Colorado Springs, CO (US)

(73) Assignee: Semtech Corporation, Camarillo, CA (US)

( * ) Notice: Subject to any disclaimer, the term of this patent is extended or adjusted under 35 U.S.C. 154(b) by 32 days.

(21) Appl. No.: 17/067,277

(22) Filed: Oct. 9, 2020

(65) Prior Publication Data

US 2021/0151359 A1    May 20, 2021

Related U.S. Application Data

(60) Provisional application No. 62/936,027, filed on Nov. 15, 2019.

(51) Int. Cl.

| | |
|---|---|
| *H01L 23/48* | (2006.01) |
| *H01L 23/31* | (2006.01) |
| *H01L 21/56* | (2006.01) |
| *H01L 23/13* | (2006.01) |
| *H01L 25/065* | (2006.01) |

(52) U.S. Cl.
CPC ........ *H01L 23/3121* (2013.01); *H01L 21/565* (2013.01); *H01L 23/13* (2013.01); *H01L 25/0655* (2013.01)

(58) Field of Classification Search
CPC ... H01L 21/565; H01L 21/56; H01L 23/3121; H01L 23/13
USPC .................. 257/773, 787; 438/112, 124, 127
See application file for complete search history.

(56) References Cited

U.S. PATENT DOCUMENTS

| | | | |
|---|---|---|---|
| 5,635,671 A | 6/1997 | Freyman et al. | |
| 6,953,988 B2 * | 10/2005 | Seo .................. | H01L 23/49548 257/796 |
| 7,781,259 B2 * | 8/2010 | Nagahama ............ | H01L 21/565 438/26 |
| 8,716,845 B2 | 5/2014 | Santos et al. | |

(Continued)

FOREIGN PATENT DOCUMENTS

JP        5037071 A        3/2008

*Primary Examiner* — Nitin Parekh
(74) *Attorney, Agent, or Firm* — Robert D. Atkins; Patent Law Group: Aktins and Associates, P.C.

(57) ABSTRACT

A semiconductor device has a substrate panel with a substrate having a first substrate area and a second substrate area outside a footprint of the first substrate area. A plurality of semiconductor die or discrete IPDs is disposed over the first substrate area. Substrate area 102a has electrical interconnect for the semiconductor die. A molding compound is disposed over the semiconductor die and first substrate area using a transfer mold process, which leaves mold culls and mold gates disposed over the second substrate area. A substrate edge is formed in the second substrate area under the mold gates. The substrate edge extends into the first substrate area under the molding compound to reinforce the mold gates and reduce cracking during mold degating. The substrate edge can have a variety of forms such as parallel bars, diagonal bars, orthogonal bars, and combinations thereof.

22 Claims, 11 Drawing Sheets

(56) References Cited

U.S. PATENT DOCUMENTS

| | | |
|---|---|---|
| 2002/0074650 A1 | 6/2002 | Takahashi et al. |
| 2005/0070051 A1* | 3/2005 | Nagahama ............ H01L 21/565 |
| | | 438/126 |
| 2012/0048595 A1* | 3/2012 | Kashiwaya ............. H01L 24/97 |
| | | 174/250 |
| 2013/0154079 A1* | 6/2013 | Kim ...................... H01L 21/563 |
| | | 257/E23.101 |
| 2014/0124947 A1* | 5/2014 | Chuang ................. H01L 23/562 |
| | | 257/E21.586 |
| 2021/0050228 A1* | 2/2021 | Bangaan ............. B29C 45/2673 |

* cited by examiner

SEMICONDUCTOR DEVICE AND METHOD OF FORMING MOLD DEGATING STRUCTURE FOR PRE-MOLDED SUBSTRATE

CLAIM TO DOMESTIC PRIORITY

The present application claims the benefit of U.S. Provisional Application No. 62/936,027, filed Nov. 15, 2019, which application is incorporated herein by reference.

FIELD OF THE INVENTION

The present invention relates in general to semiconductor devices and, more particularly, to a semiconductor device and method of forming a mold degating structure for a pre-molded substrate.

BACKGROUND

Semiconductor devices are commonly found in modern electronic products. Semiconductor devices perform a wide range of functions such as signal processing, high-speed calculations, transmitting and receiving electromagnetic signals, controlling electronic devices, photo-electric, and creating visual images for television displays. Semiconductor devices are found in the fields of communications, power conversion, networks, computers, entertainment, and consumer products. Semiconductor devices are also found in military applications, aviation, automotive, industrial controllers, and office equipment.

A semiconductor die and/or discrete integrated passive device (IPD) can be integrated into a semiconductor package. FIG. 1 illustrates a conventional semiconductor substrate panel 50 with substrate 52 containing vertical conductive interconnects 54 and semiconductor die or passive IPDs 56 mounted to the conductive interconnects with bumps 58. The semiconductor die or discrete IPDs 56 are mounted to substrate 52 for structural support and electrical interconnect. Encapsulant or mold compound 60 is deposited over the semiconductor die, discrete IPDs, and substrate panel using a transfer molding process. Semiconductor substrate panel 50 is placed in a mold cavity. A predetermined amount of molding compound is placed in a transfer pot, heated and then forced into the mold cavity to cover semiconductor die or discrete IPDs 56 and substrate 52. Mold gate 62 remains after the mold transfer. Mold gate 62 is supported by substrate edge 68 which is disposed completely outside a footprint of encapsulant 60 over semiconductor die 56. Substrate edge 68 is made of copper (Cu) with solid rail edge 70 and circular stud pattern 72.

Semiconductor substrate panel 50 is known to crack or break-off about location 80 during mold degating, i.e., when removing mold gate 62. Mold compound 60 is highly tacky and can break off some metal from electrical interconnect 54 around the perimeter of semiconductor substrate panel 50 during mold degating, which causes defects and reduces yield. One known approach to cracking is to plate electrical interconnect 54 with gold at least around the perimeter of semiconductor substrate panel 50. However, gold plating increases manufacturing cost.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The term "semiconductor die" as used herein refers to both the singular and plural form of the words, and accordingly, can refer to both a single semiconductor device and multiple semiconductor devices.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 1:
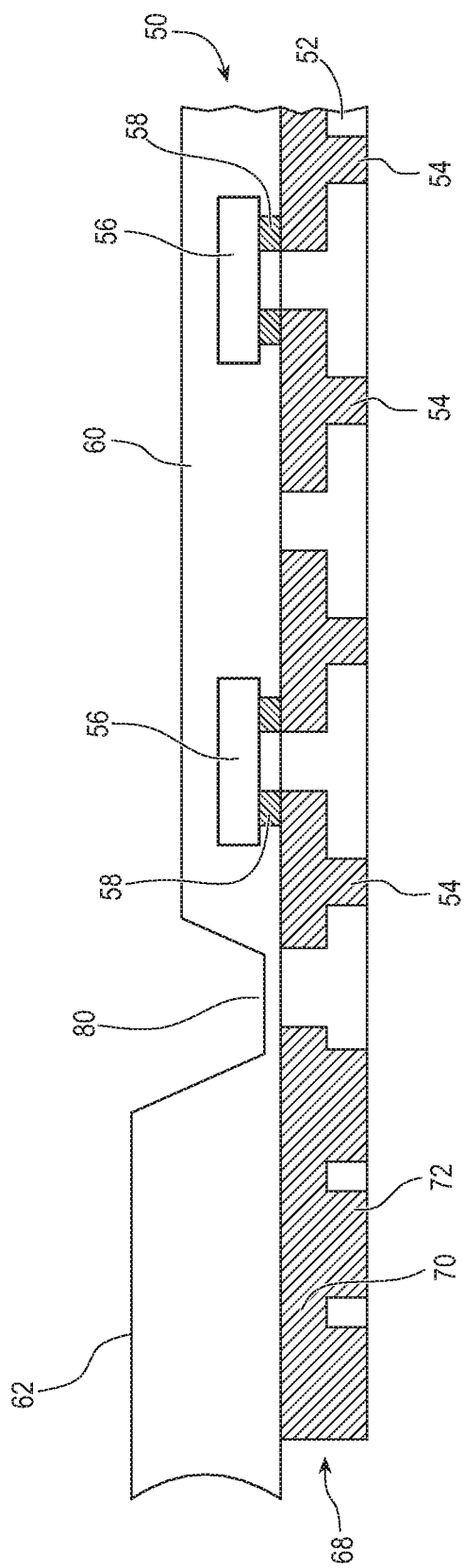
FIG. 1 illustrates a conventional semiconductor substrate panel susceptible to cracking.
Figure 2:
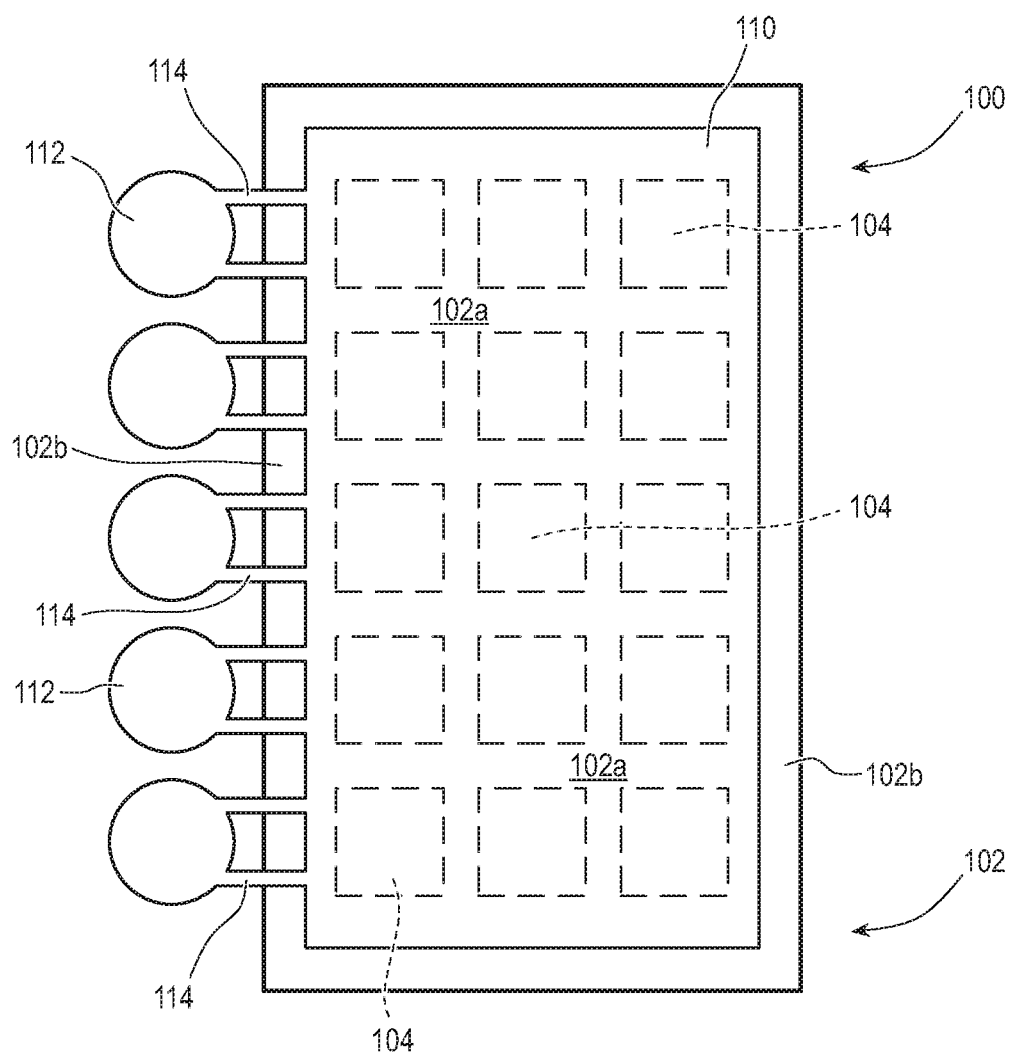
FIG. 2 illustrates a semiconductor substrate panel with mold gate transfer structure.

FIG. 2 shows a semiconductor panel 100 with substrate 102 providing structure support and electrical interconnect for a plurality of semiconductor die or discrete IPDs 104. The active surface of semiconductor die 104 contains analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within the active surface to implement analog circuits or digital circuits, such as digital signal processor (DSP), application specific integrated circuits (ASIC), memory, or other signal processing circuit. Semiconductor die 104 may also contain IPDs, such as inductors, capacitors, and resistors, for RF signal processing.

Semiconductor die or discrete IPDs 104 are disposed in substrate area 102a of substrate 102 using a pick and place operation. Substrate area 102b is that portion of substrate 102 around and outside a footprint of substrate area 102a. No semiconductor die 104 are disposed on substrate area 102b. Semiconductor substrate panel 100 may contain hundreds or thousands of semiconductor die 104.

Encapsulant or mold compound 110 is deposited over semiconductor die or discrete IPDs 104 and substrate area 102a using a transfer molding process. An unmolded semiconductor substrate panel 100 is placed in a mold cavity. A predetermined amount of molding compound is placed in a transfer pot, heated and then forced under pressure, e.g. by plunger, through a gate into the mold cavity to cover semiconductor die or discrete IPDs 104 and substrate 102a. Mold cull 112 and mold gate 114 remain after the mold transfer. Mold cull 112 is the remaining or excess mold material in the transfer pot post mold. Mold gate 114 is the remaining mold material in the gate post mold. Encapsulant 110 can be polymer composite material, such as epoxy resin with filler, epoxy acrylate with filler, or polymer with proper filler. Encapsulant 110 is non-conductive, provides structural support, and environmentally protects the semiconductor device from external elements and contaminants.

Figure 3A:
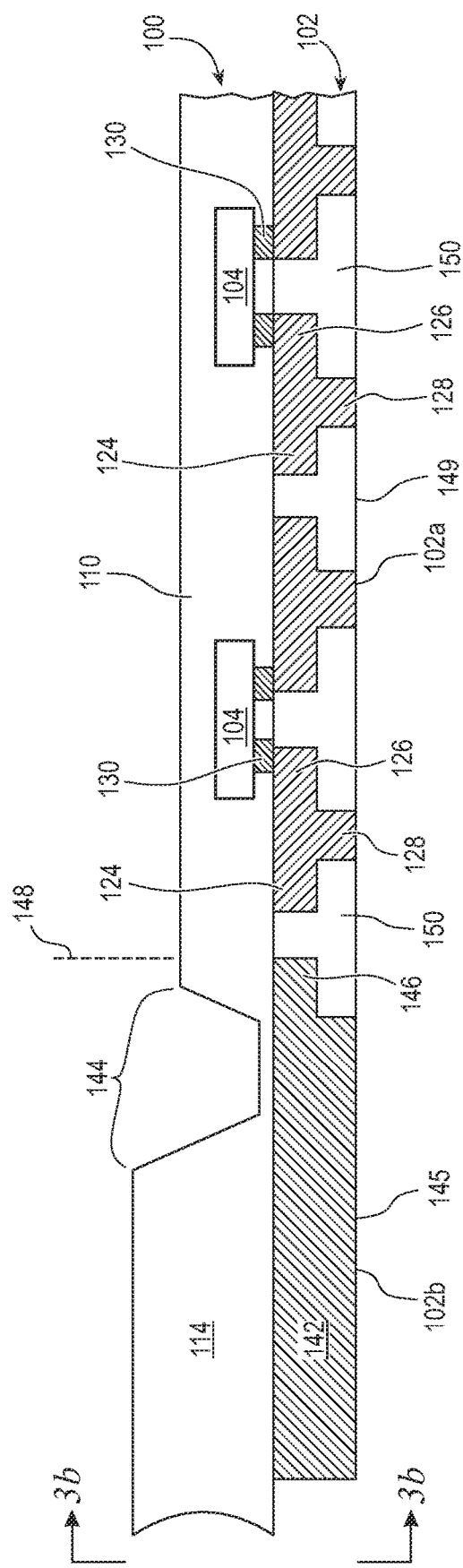
FIGS. 3a-3b illustrate further detail of the semiconductor substrate panel with a substrate edge reinforcement structure.

FIG. 3a illustrates further detail of a portion of semiconductor substrate panel 100 with substrate area 102a containing vertical conductive interconnects 124 including conductive traces 126 and conductive vias 128 made using PVD, CVD, electrolytic plating, electroless plating process, or other suitable metal deposition process. Conductive traces 126 and conductive vias 128 can be one or more layers of aluminum (Al), copper (Cu), tin (Sn), nickel (Ni), gold (Au), silver (Ag), or other suitable electrically conductive material. The semiconductor die or discrete IPDs 104 are mounted to conductive traces 126 of substrate area 102a with bumps 130, e.g. in a flipchip arrangement, for structural support and electrical interconnect.

Encapsulant or mold compound 110 is deposited over the semiconductor die or discrete IPDs 104 and substrate area 102a, leaving mold gate 114, see FIG. 2. In one embodiment, mold gate 114 is supported by a solid metal substrate edge 142 in substrate area 102b. Substrate edge 142 is formed over substrate 102 using PVD, CVD, electrolytic plating, electroless plating process, or other suitable metal deposition process. Substrate edge 142 includes one or more layers of Al, Cu, Sn, Ni, Au, Ag, Ti, TiW, W, or other suitable material or combination thereof.

Surface 145 of substrate edge 142 is coplanar with bottom surface 149 of substrate 102. Substrate edge 142 extends across area 144 and cantilever portion 146 of substrate edge 142 further extends under a portion of encapsulant 110 about 4-5 millimeters (mm) to location 148. An underfill material 150 is formed in substrate area 102a between conductive vias 128 and under cantilever portion 146. Underfill material 150 is also formed around substrate edge 142 in substrate area 102b. Underfill material 150 can be an epoxy-resin adhesive material. Substrate edge 142 extending across area 144 and cantilever portion 146 extending under encapsulant 110 provides reinforcement and reduces occurrences of cracking or damage to semiconductor substrate panel 100 during mold degating.

Figure 3B:
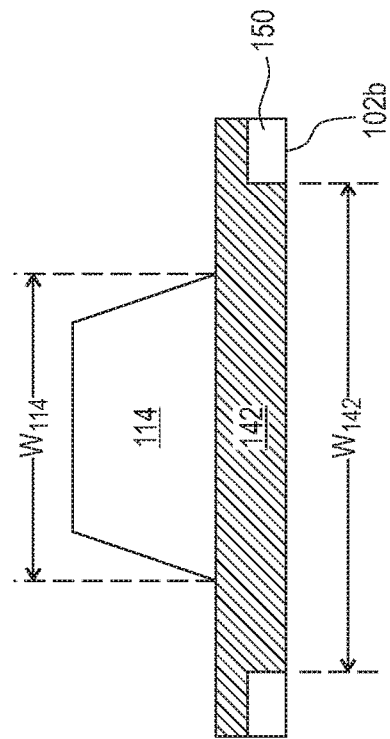

FIG. 3b is a cross-sectional view of mold gate 114 and substrate edge 142 from the prospective shown in FIG. 3a. Mold gate 114 has a width $W_{114}$ of approximately 2.5 mm. Substrate edge 142 has a width $W_{142}$ of approximately 4.0 mm.

Figure 4:
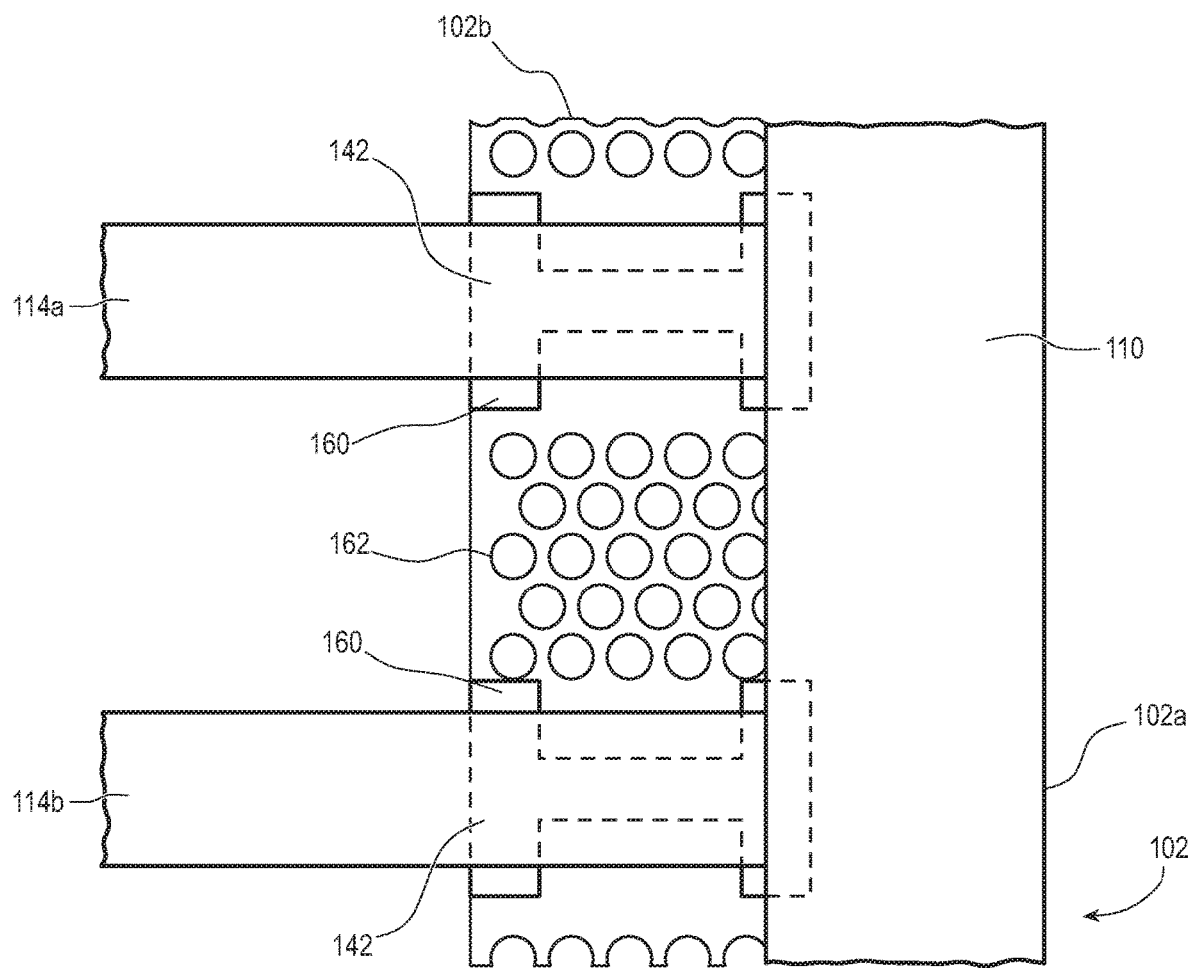
FIG. 4 illustrates a top view of the substrate edge structure.

FIG. 4 is a top view of two mold gates 114a and 114b providing transfer molding of encapsulant 110 over substrate area 102a. In one embodiment, substrate edge 142 has a "H" shape 160, as illustrated by dashed lines. Circles 162 form a dummy plated Cu pattern in substrate area 102b, i.e., no electrical function.

Figure 5:
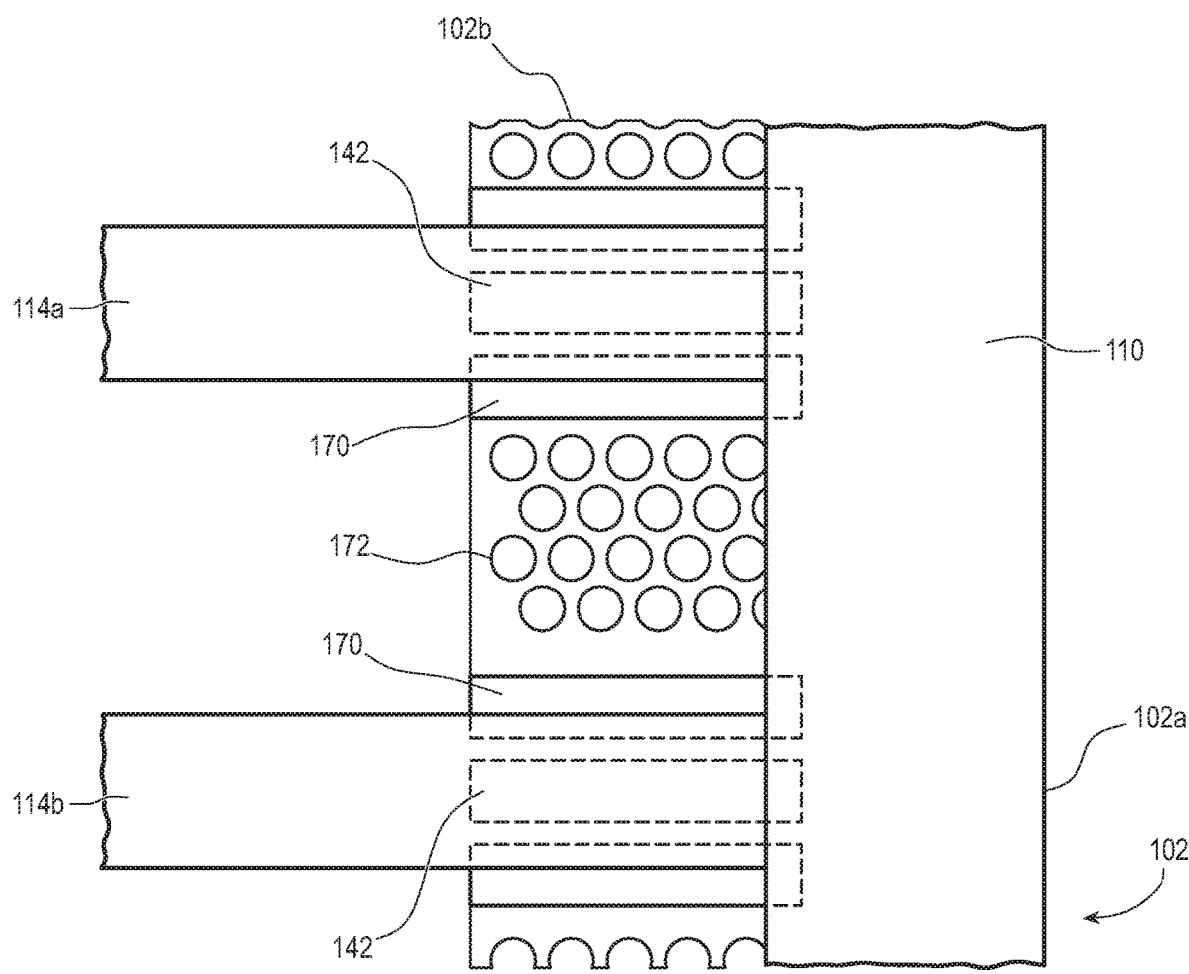
FIG. 5 illustrates a second embodiment of the substrate edge structure.

FIG. 5 is a top view of another embodiment of two mold gates 114a and 114b providing transfer molding of encapsulant 110 over substrate area 102a. In this case, substrate edge 142 has a plurality of parallel bars 170. Circles 172 form a dummy plated Cu pattern in substrate area 102b, i.e., no electrical function.

Figure 6:
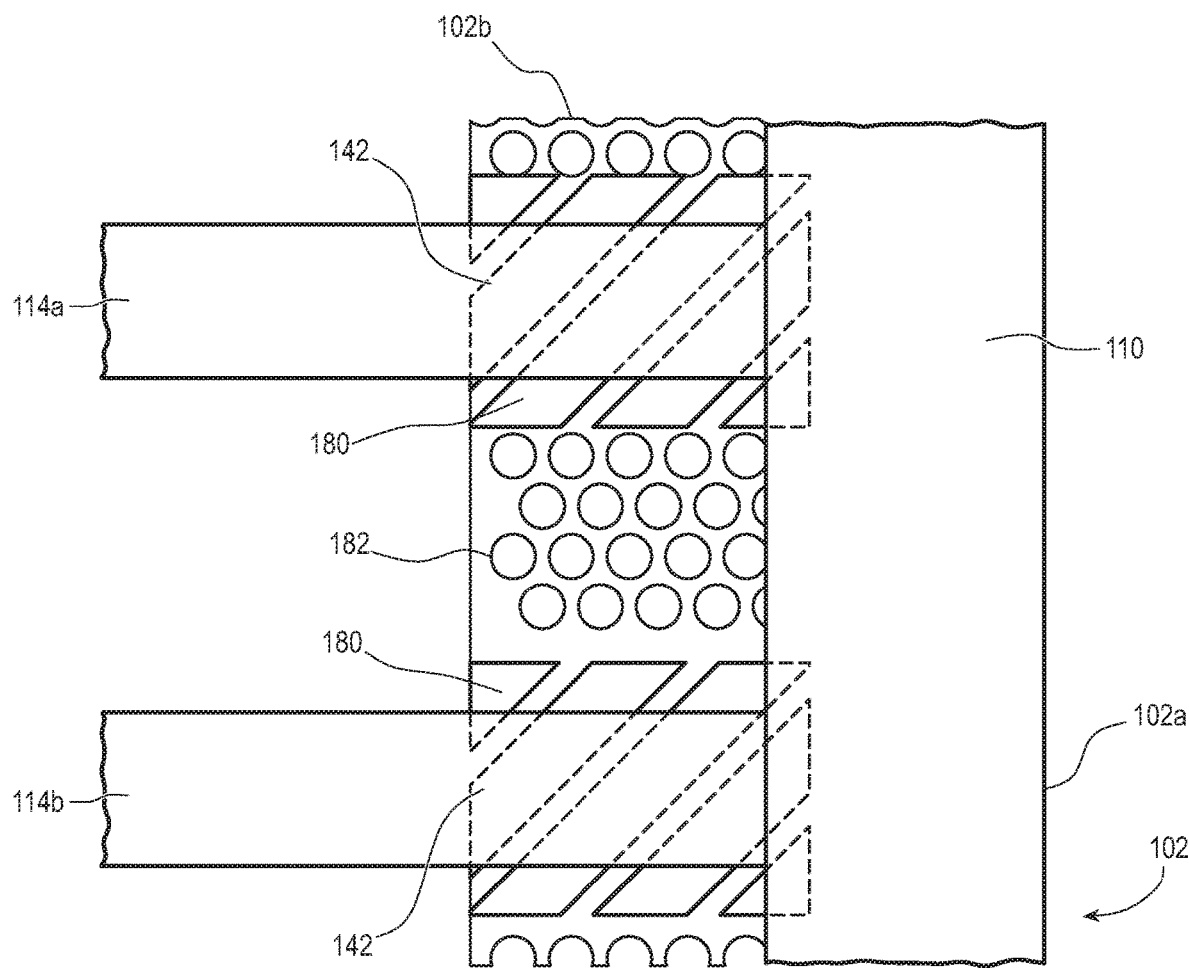
FIG. 6 illustrates a third embodiment of the mold substrate edge structure.

FIG. 6 is a top view of another embodiment of two mold gates 114a and 114b providing transfer molding of encapsulant 110 over substrate area 102a. In this case, substrate edge 142 has a plurality of diagonal parallel bars 180. Circles 182 form a dummy plated Cu pattern in substrate area 102b, i.e., no electrical function.

Figure 7A:
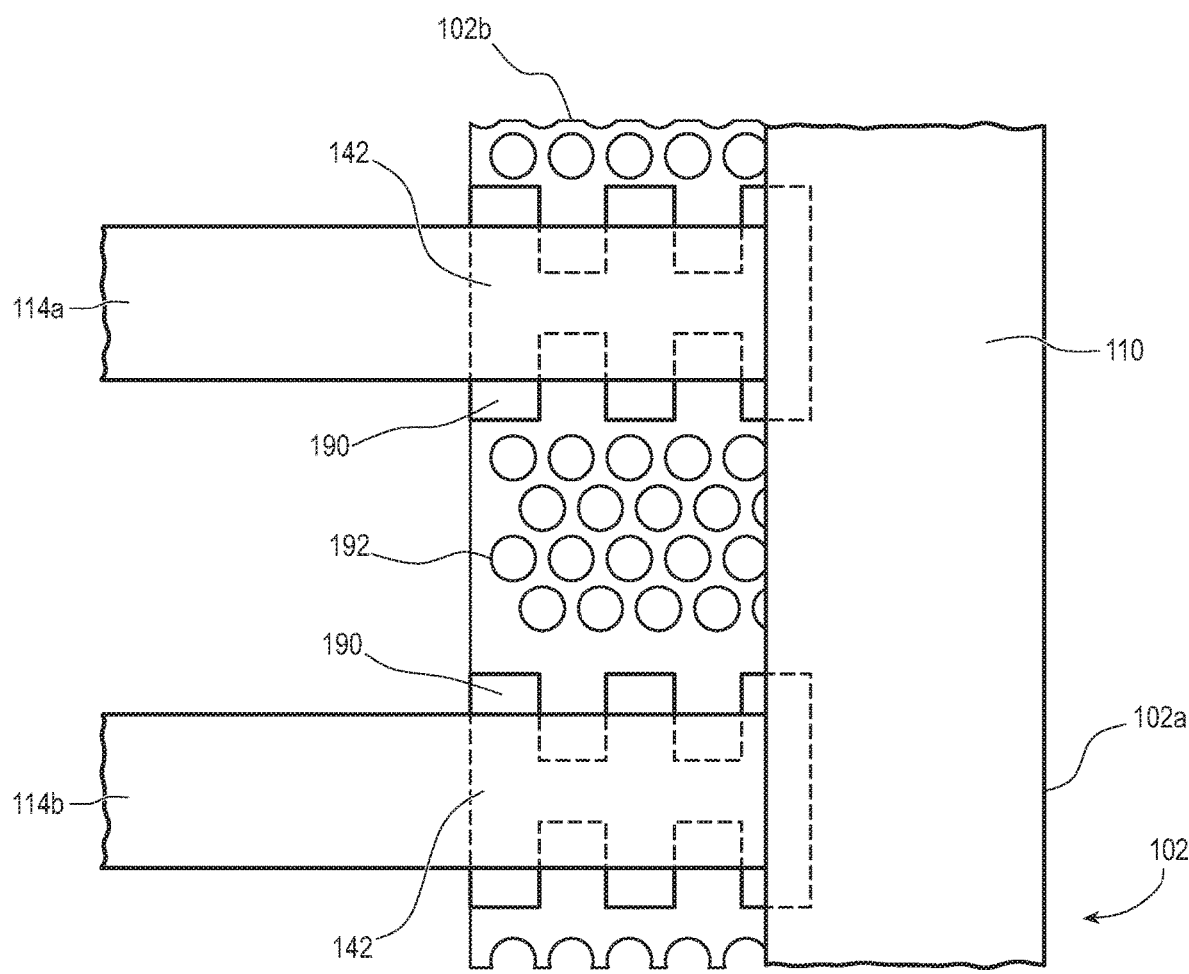
FIGS. 7a-7b illustrate a fourth embodiment of the substrate edge structure.

FIG. 7a is a top view of another embodiment of two mold gates 114a and 114b providing transfer molding of encapsulant 110 over substrate area 102a. In this case, substrate edge 142 has a plurality of interconnected parallel bars 190. Circles 192 form a dummy plated Cu pattern in substrate area 102b, i.e., no electrical function.

Figure 7B:
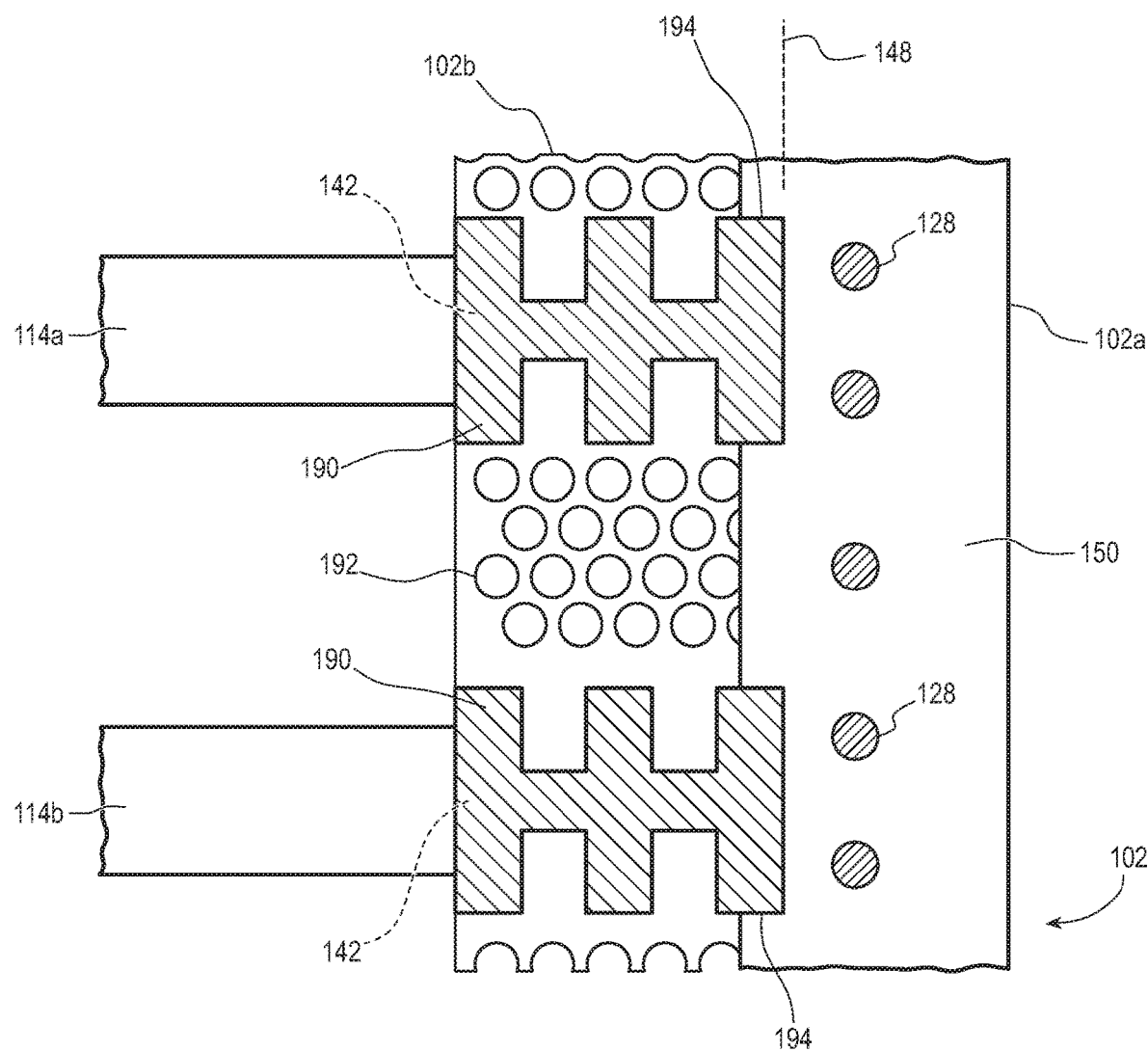

FIG. 7b is a bottom view of the embodiment from FIG. 7a. Substrate edge 142 extends into substrate area 102a under encapsulant 110 from boundary 194 between substrate area 102a and 102b to at least location 148. The interconnected parallel bars 190 are coplanar with the bottom surface of substrate area 102b.

Figure 8:
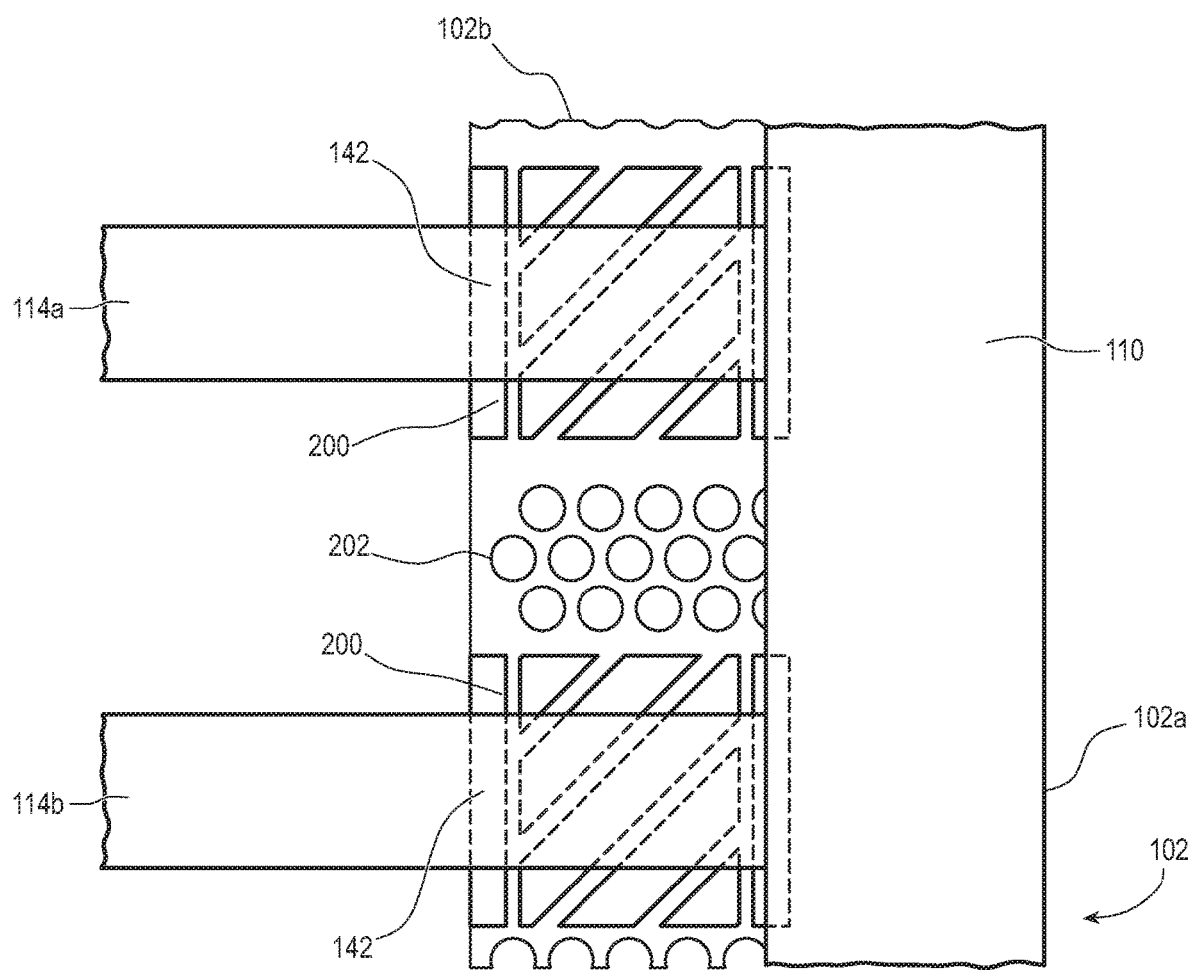
FIG. 8 illustrates a fifth embodiment of the substrate edge structure.

FIG. 8 is a top view of another embodiment of two mold gates 114a and 114b providing transfer molding of encapsulant 110 over substrate area 102a. In this case, substrate edge 142 has a plurality of diagonal bars and parallel bars 200. Circles 202 form a dummy plated Cu pattern in substrate area 102b, i.e., no electrical function.

Figure 9:
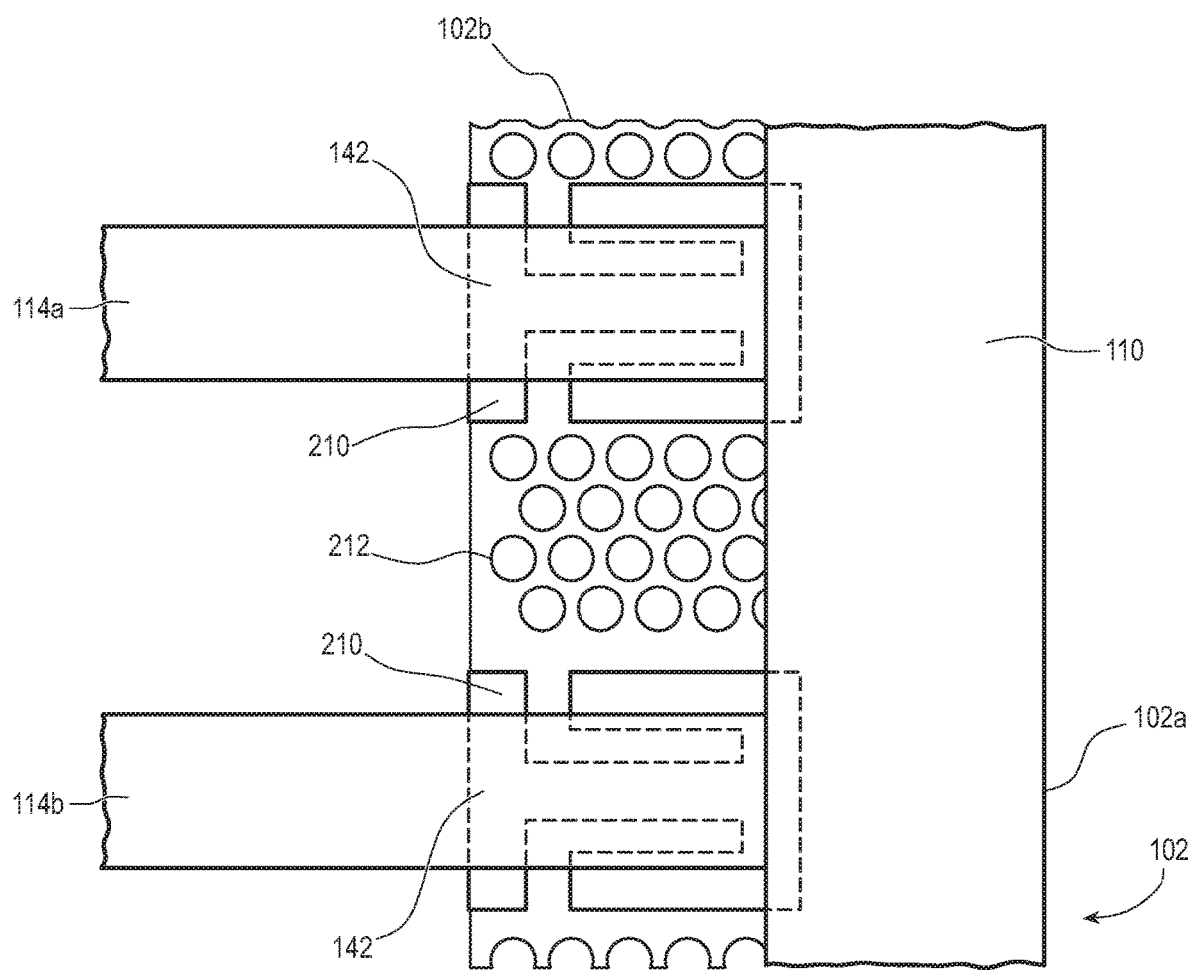
FIG. 9 illustrates a sixth embodiment of the substrate edge structure.

FIG. 9 is a top view of another embodiment of two mold gates 114a and 114b providing transfer molding of encapsulant 110 over substrate area 102a. In this case, substrate edge 142 has a plurality of parallel and orthogonal bars 210. Circles 212 form a dummy plated Cu pattern in substrate area 102b, i.e., no electrical function.

Figure 10:
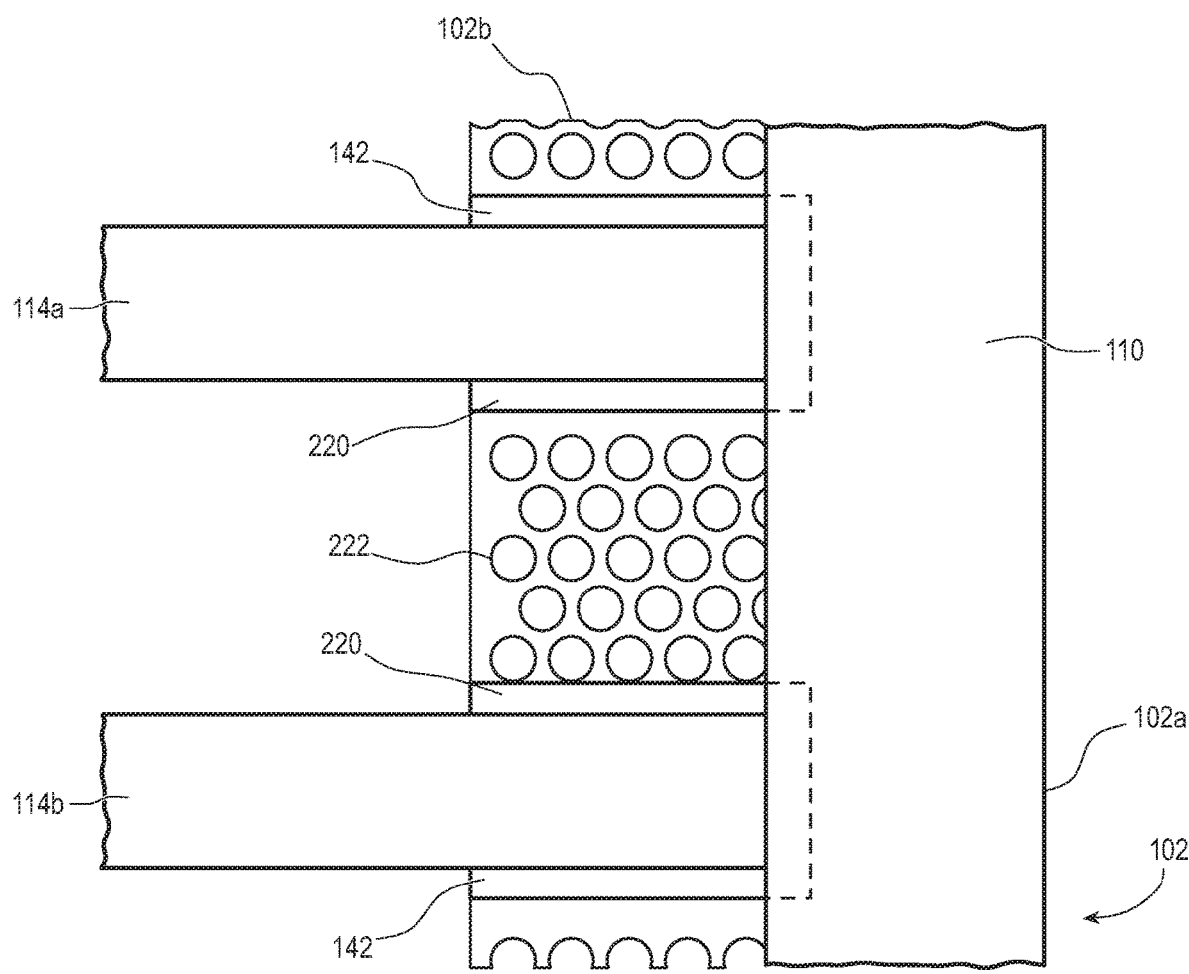
FIG. 10 illustrates a seventh embodiment of the substrate edge structure.

FIG. 10 is a top view of another embodiment of two mold gates 114a and 114b providing transfer molding of encapsulant 110 over substrate area 102a. In this case, substrate edge 142 is a solid square 220. Circles 222 form a dummy plated Cu pattern in substrate area 102b, i.e., no electrical function.

With each of the above examples, substrate edge 142 provides reinforcement under mold gates 114a and 114b and substrate area 102a to prevent damage to substrate panel 100 when the mold gates are removed.

While one or more embodiments of the present invention have been illustrated in detail, the skilled artisan will appreciate that modifications and adaptations to those embodiments may be made without departing from the scope of the present invention as set forth in the following claims.

What is claimed:

1. A semiconductor device, comprising:
   a substrate panel including a substrate comprising a first substrate area and a second substrate area outside a footprint of the first substrate area, and a plurality of semiconductor die disposed over the first substrate area;
   a molding compound disposed over the plurality of semiconductor die and first substrate area; and
   a substrate edge formed in part in the second substrate area and extending from the second substrate area into the first substrate area under the molding compound.

2. The semiconductor device of claim 1, wherein the substrate edge has a shape selected from a group consisting of solid square, interconnected bars, diagonal bars, and parallel bars.

3. The semiconductor device of claim 1, wherein a portion of the molding compound extends over the second substrate area.

4. The semiconductor device of claim 1, wherein the substrate edge includes a cantilever portion extending under the molding compound.

5. The semiconductor device of claim 1, wherein a surface of the substrate edge is coplanar with a surface of the substrate.

6. The semiconductor device of claim 1, further including a dummy metal pattern formed on the second substrate area.

7. The semiconductor device of claim 1, further including a mold gate extending over the second substrate area, wherein the mold gate is supported by the substrate edge.

8. A semiconductor device, comprising:
   a substrate panel including a substrate comprising a first substrate area and a second substrate area, and a plurality of semiconductor die disposed over the first substrate area;
   a molding compound disposed over the plurality of semiconductor die and first substrate area; and
   a substrate edge formed in part in the second substrate area and extending from the second substrate area into the first substrate area.

9. The semiconductor device of claim 8, wherein the second substrate area is disposed outside a footprint of the first substrate area.

10. The semiconductor device of claim 8, wherein the substrate edge has a shape selected from a group consisting of solid square, interconnected bars, diagonal bars, and parallel bars.

11. The semiconductor device of claim 8, wherein a portion of the molding compound extends over the second substrate area.

12. The semiconductor device of claim 8, wherein the substrate edge includes a cantilever portion extending under the molding compound.

13. The semiconductor device of claim 8, wherein a surface of the substrate edge is coplanar with a surface of the substrate.

14. The semiconductor device of claim 8, further including a dummy metal pattern formed on the second substrate area.

15. The semiconductor device of claim 8, further including a mold gate extending over the second substrate area, wherein the mold gate is supported by the substrate edge.

16. A method of making a semiconductor device, comprising:
   providing a substrate panel including a substrate comprising a first substrate area and a second substrate area, and a plurality of semiconductor die disposed over the first substrate area;
   depositing a molding compound over the plurality of semiconductor die and first substrate area; and
   forming a substrate edge in part in the second substrate area and extending from the second substrate area into the first substrate area.

17. The method of claim 16, wherein the second substrate area is disposed outside a footprint of the first substrate area.

18. The semiconductor device of claim 16, wherein the substrate edge has a shape selected from a group consisting of solid square, interconnected bars, diagonal bars, and parallel bars.

19. The semiconductor device of claim 16, wherein a portion of the molding compound extends over the second substrate area.

20. The semiconductor device of claim 16, wherein the substrate edge includes a cantilever portion extending under the molding compound.

21. The semiconductor device of claim 16, wherein a surface of the substrate edge is coplanar with a surface of the substrate.

22. The semiconductor device of claim 16, further including a dummy metal pattern formed on the second substrate area.

* * * * *